United States Patent

Shi et al.

[11] Patent Number: 5,817,431
[45] Date of Patent: Oct. 6, 1998

[54] ELECTRON INJECTING MATERIALS FOR ORGANIC ELECTROLUMINESCENT DEVICES AND DEVICES USING SAME

[75] Inventors: Song Shi, Phoenix; Franky So, Tempe, both of Ariz.; H. C. Lee, Calabasas, Calif.

[73] Assignee: Motorola, Inc., Schaumburg, Ill.

[21] Appl. No.: 777,922

[22] Filed: Dec. 23, 1996

[51] Int. Cl.[6] .................................. H05B 33/20
[52] U.S. Cl. ................... 428/690; 425/691; 425/917; 313/503; 313/504; 313/505; 313/506; 313/507; 313/508; 313/509
[58] Field of Search ................... 428/690, 917, 428/691; 313/503–509

[56] References Cited

U.S. PATENT DOCUMENTS

| | | | |
|---|---|---|---|
| 4,539,507 | 9/1985 | VanSlyke et al. | 313/504 |
| 5,256,945 | 10/1993 | Imai et al | 313/504 |
| 5,443,921 | 8/1995 | Hasokawa et al. | 428/690 |
| 5,518,824 | 5/1996 | Funhoff et al. | 428/690 |
| 5,620,806 | 4/1997 | Nakamura et al. | 428/690 |
| 5,645,948 | 7/1997 | Shi et al. | 428/690 |

*Primary Examiner*—Charles Nold
*Attorney, Agent, or Firm*—Eugene A. Parsons

[57] ABSTRACT

An organic electroluminescent display device (10) includes a plurality of organic layers (16, 18, 20, 22 and 24) disposed between opposing electrodes (14 and 26). The electron injecting layer (24) is characterized by the formula:

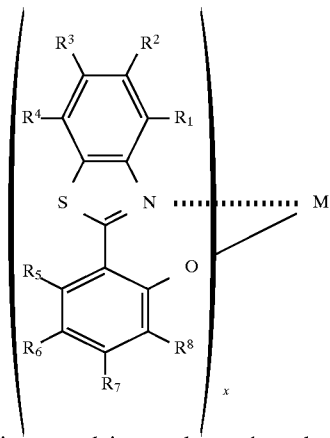

wherein M is a metal ion, and may be selected from the group consisting of $Zn^{2+}$, $Mg^{2+}$, $Be^{2+}$, $Al^{3+}$, and $Ga^{3+}$; $X=2$ or 3; and $R_1$ to $R_8$ represent functional groups selected from the group consisting of hydrogen, hydrocarbon groups or functional groups such as cyano, halides, haloalkyl, haloalkoxy, alkoxyl, amido, amino, sulfonyl, carbonyl, carbonyloxy, oxycarbonyl, and combinations thereof.

9 Claims, 1 Drawing Sheet

ELECTRON INJECTING MATERIALS FOR ORGANIC ELECTROLUMINESCENT DEVICES AND DEVICES USING SAME

TECHNICAL FIELD

This invention relates in general to flat panel information display devices and in particular to light emitting organic electroluminescent information display devices.

BACKGROUND OF THE INVENTION

Until fairly recently, the preferred, indeed the only means by which to display information in the electronic medium was to use a video monitor comprising a cathode ray tube ("CRT"). CRT technology has been well known for over 50 years, and has gained widespread commercial acceptance in applications ranging from desktop computer modules to home televisions and industrial applications. CRTs are essentially large vacuum tubes having one substantially planar surface upon which information is displayed. Coated on the inside of the CRT planar surface is a layer of phosphors which emit light when struck by electrons emitted from the electron gun of the CRT. The electron gun is disposed in an elongated portion which extends away from the inside CRT planar surface.

While CRTs are widely used in numerous applications, there are several inherent limitations to the application of CRT technology. For example, CRTs are relatively large and consume a great deal of energy. Moreover, as display screen gets larger, the electron gun must be positioned farther from the phosphor surface. As CRT's are fabricated of glass, the display screen gets incrementally larger, the overall weight of the display gets substantially heavier. Given the need for the electron gun to be spacedly disposed from the phosphor surface, CRTs have a substantial depth dimension which grows exponentially larger with increasing displays size.

Accordingly, CRTs are of little value for small and portable applications, such as Walkmen, laptop computers, and other portable electronic applications which require the use of displays.

To answer the needs of the marketplace for smaller, more portable display devices, manufacturers have created numerous types of flat panel displays. Examples of flat panel display devices include active matrix liquid crystal displays ("AMLCD's"), plasma displays, and electroluminescent displays. Each of these types of displays has use for a particular market application, though each are accompanied by various limitations which make them less than ideal for certain applications. Principal limitations inherent in devices such as AMLCDs relate to the fact that they are fabricated predominantly of inorganic semiconductor materials by semiconductor fabrication processes. These materials and processes are extremely expensive and, due to the complexity of the manufacturing process, cannot be reliably manufactured in high yields. Accordingly, the costs of these devices are very high with no promise of immediate cost reduction.

One preferred type of device which is currently receiving substantial research effort is the organic electroluminescent display device. Organic electroluminescent devices ("OED") are generally composed of three layers of organic molecules sandwiched between transparent, conductive and/or metallic conductive electrodes. The three layers include an electron transporting layer, an emissive layer, and a hole transporting layer. Typical devices also include an electron injecting layer and a hole injecting layer as well. Electrons and holes are the charge carriers which combine in the emissive layer to emit light. Electrons are negatively charged atomic particles and holes are the positively charged counterparts.

OEDs are attractive to device designers because they require a low driving voltage, i.e., less than about 20 volts. Hence, they have a potential application to full color flat emissive displays. Though significant lifetime for OEDs has been achieved as described in, for example, U.S. Pat. No. 4,720,432 to VanSlyke, et al, further improvement is needed for applications in which high brightness is a requirement.

Heretofore, when an electron injecting layer was present, it has typically been fabricated of a material known as Alq, which is an abbreviation for tris(8-hydroxyquinolinate) aluminum. This material has been able to provide OEDs with luminous efficiencies on the order of 15 lumens per watt (Lm/W). In typical OED's, the structure of the device, is a first electrode, a hole transporting material, Alq. (the electron transporting layer), and a second electrode fabricated of a magnesium-aluminum alloy. A device with this structure yields an OED operating at 9 volts (V), 20 milliamperes per centimeter squared (mA/cm$^2$), and with light output of 700 candela per meter squared (Cd/m$^2$).

One factor limiting the efficiency of this type of device is the high electron injecting barrier from the cathode electrode, i.e., the Mg—Al electrode. This is due to the fact that the Alq. has a relatively high ionization work function as compared to the electrode.

Accordingly, there exists a need for improved materials for use as the electron injecting and/or transporting layers in OEDs. Such a material should be relatively inexpensive and easy to fabricate as well as being conducive to manufacturing in current OED manufacturing process. The resulting device should have good thermal stability, and be capable of operating at voltages which are within the range of those generally accepted for OEDs.

DETAILED DESCRIPTION OF THE PREFERRED EMBODIMENT

Figure 1:
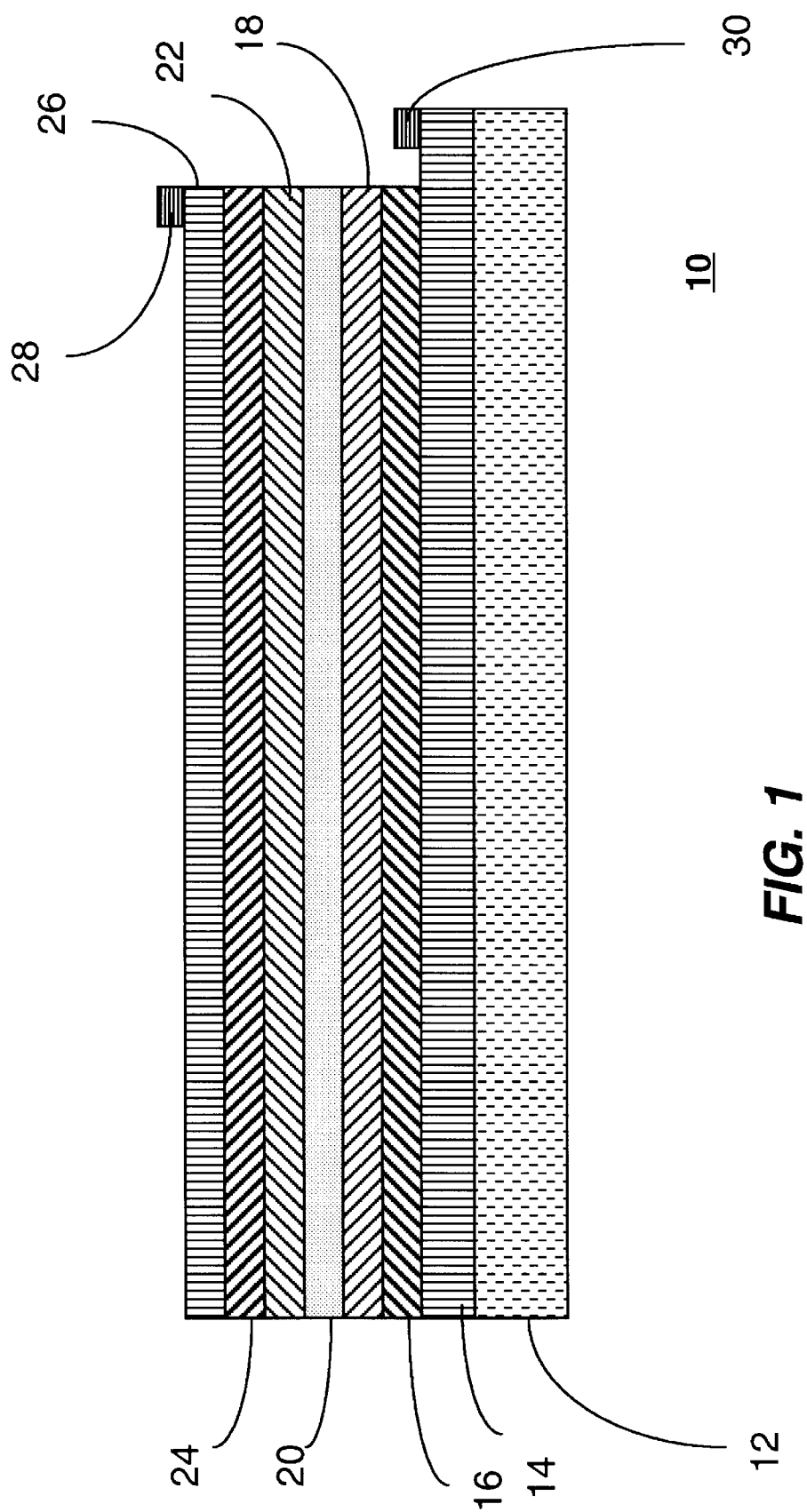
FIG. 1 is a cross-sectional side view of an organic electroluminescent device in accordance with the instant invention.

While the specification concludes with claims defining the features of the invention that are regarded as novel, it is believed that the invention will be better understood from a consideration of the following description in conjunction with the drawing figures, in which like reference numerals are carried forward.

The invention relates to the development of new materials for use as the electron injecting layer in OEDs. It is to be understood however, that the materials described herein are not so limited. Indeed, such materials may find applicability as other layers in an OED, such as the electron transporting layer as well. The electron injecting material of the subject invention may be characterized by the following formula:

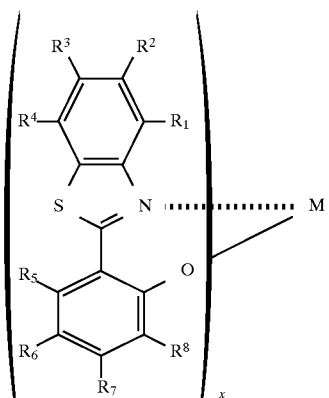

Formula I

Where M is a metal ion, and may be selected from the group consisting of $Zn^{2+}$, $Mg^{2+}$, $Be^{2+}$, $Al^{3+}$, and $Ga^{3+}$. X=2 or 3 depending on the selection of "M". $R_1$ to $R_8$ represent substitution possibilities at each position and each represents a functional group selected from the group consisting of hydrogen, hydrocarbon groups or functional groups such as cyano, halides, haloalkyl, haloalkoxy, alkoxyl, amido, amino, sulfonyl, carbonyl, carbonyloxy, oxycarbonyl, and combinations thereof. $R_1$ to $R_8$ may be the same functional group. Alternatively, one or more, indeed all, may be different. In one preferred embodiment, R1 to R8 are all H, and $M=Zn^{2++}$ $X=2$. In such an instance the material is known as ZnSPB. This material is also known as bis(2-(oxo-phenyl) -benzothiazole) zinc.

Referring now to FIG. 1, there is illustrated therein an organic electroluminescent device as is well known in the art. The device 10 contains, as a rule, one or more layers of organic charge transport materials. The device 10 is fabricated upon a first substrate 12 which is transparent and may be fabricated of any of the number of known materials employed in the art. For example, the substrate 12 may be fabricated of a glass, such as a Corning 7059 glass, transparent plastic substrates made of polyolefins, polyethersulfones, polyarylates. In one preferred embodiment, the substrate 12 is fabricated of glass of quality good for flat panel display applications.

Deposited atop substrate 12 is a first electrode 14, which is electrically conductive and optically transparent or semi-transparent. Several materials may be advantageously employed as the first electrode for an OED device. Examples of materials include conductive metal oxides such as indium oxide, indium-tin oxide (ITO), zinc oxide, zinc-tin oxide, and conductive transparent polymers such as polyaniline. Alternatively, the electrode 14 may be fabricated of a semi-transparent metal, examples of which include a thin layer (<500 Å) of gold, copper, silver, and combinations thereof. In one preferred embodiment, the electrode 14 is fabricated of ITO or zinc oxide.

Thereafter, a first layer of an organic material is deposited atop the first electrode 14. The first layer 16 is an organic material adapted to accept holes from the first electrode 14, the holes being for subsequent combination with electrons in the emitter layer described herein below. The layer 16 is known as the hole injecting layer and may also act as a buffer layer to match the thermal and mechanical properties of the first electrode and the subsequent layers of organic materials. The hole injection layer is preferably comprised of a porphyrinic compound of the type disclosed by Adler in U.S. Pat. No. 3,935,031 or Tang in U.S. Pat. No. 4,356,429. Examples of the preferred compounds include copper phthalocyanine, and zinc phthalocyanine.

Thereafter deposited atop the hole injecting layer 16 is a hole transporting layer 18. The purpose of the hole transporting layer is to facilitate the transport of holes from the hole injecting layer 16 to the emitter layer 20 where they are combined with the electrons to create photons for the emission of light. The hole transporting layer 18 may be fabricated of a material such as is described in commonly assigned, co-pending patent application Ser. No. 08/706, 898, filed Sep. 3, 1996, in the names of Shi, et al the disclosure of which is incorporated herein by reference.

Thereafter deposited atop the hole transporting layer 18 is a layer of emitter 20. The emitter layer 20 is typically comprised of a host emitting matrix and a guest emitter. The host emitting matrix is fabricated of an organic material adapted to accommodate both holes and electrons and then transfer the excited state energies to the guest emitter, wherein the holes and electrons combine and emit a photon of light causing a visible change in the appearance of the OED to a viewer thereof. The materials that can be used as the host emitting matrix include metal chelated oxinoid compounds disclosed in U.S. Pat. No. 4,769,292 and U.S. Pat. No. 5,529,853, and organometallic complexes disclosed in a commonly assigned, copending U.S. patent application entitled "NEW ORGANOMETALLIC COMPLEXES FOR USE IN LIGHT EMITTING DEVICES", filed 12 Sep. 1994, bearing Ser. No. 08/304,451. Examples of the preferred host emitting matrix materials are selected from tris(8-quinolinol) aluminum, bis(10-oxo-benzo[h] quinoline beryllium, bis(2-(2-oxy-phenyl)benzoxazole) zinc, bis(2-(2-oxyphenyl)benzothiazole) zinc. The materials that can be used as a guest emitter include dyes and pigments of high fluorescent efficiency. For efficient energy transfer, it is necessary that the guest emitter material has a bandgap no greater than that of the material making up the emitting host matrix. It is preferred that the guest emitter material is present in a concentration of from $10^{-3}$ to 10 mole percent, based on the moles of the material comprised of the emitting host matrix. The selection of the guest emitting materials is well known to those skilled in the art.

Thereafter deposited atop the emitter layer 20 is an electron transporting layer 22 fabricated of, for example, a material selected from the group of materials disclosed in U.S. Pat. No. 4,769,292 and U.S. Pat. No. 5,529,853, and the previously mentioned patent application Ser. No. 08/304, 451. The electron transporting layer, like the hole transporting layer 18, is adapted to gather charge carriers, in this case electrons, generated in an electron injecting layer for transport to the emitter layer where they are combined with holes as described hereinabove. In this regard, characteristics of an appropriate electron transporting layer include tris(8-quinolinol) aluminum, bis(10-oxo-benzo[h] quinoline beryllium, bis(2-(2-oxyphenyl)benzoxazole) zinc, bis(2-(2-oxy-phenyl)benzothiazole) zinc, and combinations thereof. Alternatively, the electron transporting material may be such as that described above.

Thereafter deposited atop the electron transporting layer is an electron injecting layer 24. The electron injecting layer is fabricated of a material as described above, and most preferably ZnSPB. The electron injecting layer 24 like the hole injecting layer 14 is adapted to accept charge carriers, in this case electrons.

Deposited atop the electron injecting layer is a second electrode 26 which is typically formed of a metal of work function of less than 4 electron volts (eV) and at least one other protective metal of higher work function. The preferred low work function metal is selected from a group of lithium, magnesium, calcium, and strontium, while the preferred high work function metal is selected from a group of aluminum, indium, copper, gold, silver. Alternatively, the second electrode is formed of an alloy of a lower work function metal and a high work function metal by coevaporation. The content of the low work function metal in the second electrode can vary from 0.1% to 50%, but is preferably below 20%.

In operation, holes inject from the first electrode (also called the anode) and electrons inject from the second electrode (also called the cathode) into the organic layers disposed between the electrically conductive electrodes 14 and 26, when an electrical current is applied between the anode and cathode. An electrical current may be applied by connecting the electrodes to electrical current generation means (not shown) at electrical contacts 28 and 30 on electrodes 26 and 14 respectively. Electrical contacts may be fabricated of any type of electrically conductive material which is mechanically compatible with the electrode materials. The material of the instant invention may be better understood from the following example:

EXAMPLE

An electroluminescent device containing the electron injecting material satisfying the requirements of the present invention was constructed by thermal evaporation method as follows: A transparent anode of indium tin oxide with a sheet resistance of 50 Ohms per square ($\Omega/\square$) was coated onto glass which was previously cleaned with isopropyl alcohol and distilled water. After drying, it was degreased with a standard UV-ozone treatment. Thereafter, a 250 Å layer of a copper phthalocyanine hole injecting material was deposited on the anode. A 500 Å thick layer of a hole transporting material, specifically, N,N'-di(1-naphthylphenyl) aminobiphenyl was then deposited on top of the hole injecting layer.

A thick layer of a tris(8-quinolinol)aluminum hole transporting material, which served as the emitter zone, was deposited on top of the hole transporting layer. Thereafter, a 200 Å thick layer of electron injecting material, specifically bis(2-(oxo-phenyl)-benzothiazole) zinc (ZnSPB) was deposited on top of the electron transporting layer. On top of the ZnSPB was co-deposited a 2000 Å thick cathode formed of a 10:1 atomic ratio of Mg and Ag.

When under forward bias, this device emitted 300 Cd/M² of green light at 5.1 volt with luminous efficiency of 2.3 Lm/W. The emission peak was approximately 530 nanometers (nm).

For comparative purposes, an electroluminescent device that did not contain the inventive electron injecting material satisfying the requirements of the present invention was constructed by thermal evaporation method as follows:

A transparent anode of indium tin oxide of sheet resistance of 50$\Omega/\square$ was coated onto glass which was previously cleaned with isopropyl alcohol and distilled water. After drying, it was degreased with a standard UV-ozone treatment. Thereafter, a 250 Å layer of a copper phthalocyane hole injecting material was deposited on the anode. A 500 Å thick layer of a hole transporting material, specifically, N,N'-di(1-naphthylphenyl)aminobiphenyl was then deposited on top of the hole injecting layer.

A thick layer of a tris(8-quinolinol)aluminum material, which served as the luminescent zone, was deposited on top of the hole transporting layer. Thereafter was deposited a 2000 Å thick cathode formed of a 10:1 atomic ratio of Mg and Ag. When under forward bias, this device, without the inventive electron injecting layer, emitted 300 cd/m² of green light at 6.7V with luminous efficiency of 1.8 Lm/W. The emission peak is also around 530 nm.

As demonstrated in the above example, the use of the disclosed electron injection material lowers the device operation voltage by about 31% and increases the luminous efficiency of the organic electroluminescent device by about 30%.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. An organic electroluminescent display device having first and second electrodes, and a plurality of organic layers disposed therebetween, at least one of said organic layers being an electron injecting material layer characterized by the formula:

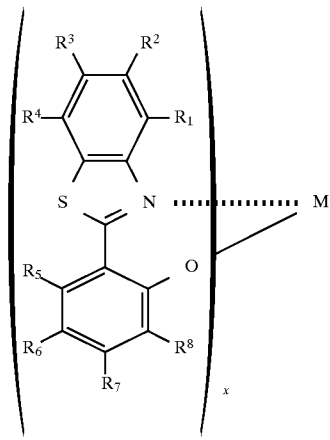

wherein M is a metal ion, and may be selected from the group consisting of $Zn^{2+}$, $Mg^{2+}$, $Be^{2+}$, $Al^{3+}$, $Ga^{3+}$; X=2 or 3; and $R_1$ to $R_8$ represent functional groups selected from the group consisting of hydrogen, hydrocarbon groups or functional groups such as cyano, halides, haloalkyl, haloalkoxy, alkoxyl, amido, amino, sulfonyl, carbonyl, carbonyloxy, oxycarbonyl, and combinations thereof.

2. An organic electroluminescent display device as in claim 1, wherein $R_1$ to $R_8$ are all the same.

3. An organic electroluminescent display device as in claim 1, wherein one or more of $R_1$ to $R_8$ are different.

4. An organic electroluminescent display device as in claim 1, wherein $R_1$ to $R_8$ are all H.

5. An organic electroluminescent display device as in claim 1, wherein M=$Zn^{2+}$.

6. An organic electroluminescent display device as in claim 1, further comprising a hole injection layer having a hole injecting material wherein the hole injecting material is bis(2-(oxo-phenyl)-benzothiazole) zinc.

7. An organic electroluminescent display device as in claim 1, wherein said electron injecting material is also an electron transporting material.

8. An organic electroluminescent display device as in claim 1, wherein at least one of said electrodes is fabricated of a magnesium-silver alloy.

9. An organic electroluminescent display device as in claim 8, wherein said electron injecting material is disposed adjacent said magnesium-silver alloy electrode.

* * * * *